(12) United States Patent
Kneer

(10) Patent No.: US 11,268,024 B2
(45) Date of Patent: Mar. 8, 2022

(54) ETCHING COMPOSITIONS

(71) Applicant: Fujifilm Electronic Materials U.S.A., Inc., N. Kingstown, RI (US)

(72) Inventor: Emil A. Kneer, Mesa, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 16/856,528

(22) Filed: Apr. 23, 2020

(65) Prior Publication Data

US 2020/0347297 A1 Nov. 5, 2020

Related U.S. Application Data

(60) Provisional application No. 62/841,305, filed on May 1, 2019.

(51) Int. Cl.
*C09K 13/00* (2006.01)
*H01L 21/306* (2006.01)

(52) U.S. Cl.
CPC ........ *C09K 13/00* (2013.01); *H01L 21/30604* (2013.01)

(58) Field of Classification Search
CPC .......................... C09K 13/00; H01L 21/30604
See application file for complete search history.

(56) References Cited

U.S. PATENT DOCUMENTS

| | | | |
|---|---|---|---|
| 5,496,485 A | 3/1996 | Matemaghan | |
| 5,725,640 A | 3/1998 | Joshi et al. | |
| 7,144,848 B2 | 12/2006 | Zhou et al. | |
| 7,232,514 B2 | 6/2007 | Liu et al. | |
| 10,155,921 B2 | 12/2018 | Cui | |
| 2004/0108302 A1* | 6/2004 | Liu | C23F 3/00 216/83 |
| 2005/0178742 A1 | 8/2005 | Chelle et al. | |
| 2010/0248480 A1* | 9/2010 | Darsillo | C23F 3/06 438/693 |
| 2015/0104952 A1 | 4/2015 | Cui | |
| 2016/0053384 A1* | 2/2016 | Adaniya | H05K 1/09 174/257 |
| 2016/0118264 A1 | 4/2016 | Kamimura et al. | |
| 2016/0185595 A1* | 6/2016 | Chen | H01L 21/02063 216/13 |
| 2018/0100128 A1 | 4/2018 | Park et al. | |
| 2019/0085271 A1* | 3/2019 | Ishida | H01L 21/02065 |
| 2019/0177671 A1* | 6/2019 | Parson | C11D 3/2096 |
| 2019/0194580 A1* | 6/2019 | Kamimura | C11D 7/261 |
| 2019/0284704 A1* | 9/2019 | Ge | H01L 21/32134 |
| 2020/0199500 A1* | 6/2020 | White | C11D 3/3445 |

FOREIGN PATENT DOCUMENTS

| | | | | |
|---|---|---|---|---|
| WO | WO 2003/104185 | 12/2003 | ........... | H01L 21/306 |
| WO | WO-2006138235 A2 * | 12/2006 | ................ | C23F 1/26 |
| WO | WO 2015/142778 | 9/2015 | ................ | C23F 1/10 |
| WO | WO 2017/205134 | 11/2017 | ............... | B08B 3/00 |

OTHER PUBLICATIONS

Specification from U.S. Appl. No. 62/783,870 by D. White et al , filed Dec. 21, 2018. (Year: 2018).*
Claim listing from U.S. Appl. No. 62/783,870 by D. White et al , filed Dec. 21, 2018. (Year: 2018).*
The International Search Report and Written Opinion of the International Searching Authority for International Application No. PCT/US2020/029536, dated Jul. 27, 2020.
International Search Report and Written Opinion of the International Searching Authority for International Application No. PCT/US2020/035697, dated Sep. 4, 2020.

* cited by examiner

*Primary Examiner* — Anita K Alanko
(74) *Attorney, Agent, or Firm* — Fish & Richardson P.C.

(57) ABSTRACT

The present disclosure is directed to etching compositions that are useful for, e.g., selectively removing cobalt (Co) from a semiconductor substrate without substantially forming cobalt oxide by-products.

24 Claims, No Drawings

ETCHING COMPOSITIONS

CROSS-REFERENCE TO RELATED APPLICATION

The present application claims priority to U.S. Provisional Application Ser. No. 62/841,305, filed on May 1, 2019, the contents of which are hereby incorporated by reference in their entirety.

FIELD OF THE DISCLOSURE

The present disclosure relates to etching compositions and processes of using etching compositions. In particular, the present disclosure relates to etching compositions that can selectively etch cobalt (Co) without substantially forming a passive layer over the etched substrate.

BACKGROUND OF THE DISCLOSURE

The semiconductor industry is rapidly decreasing the dimensions and increasing the density of electronic circuitry and electronic components in microelectronic devices, silicon chips, liquid crystal displays, MEMS (Micro Electro Mechanical Systems), printed wiring boards, and the like. The integrated circuits within them are being layered or stacked with constantly decreasing thicknesses of the insulating layer between each circuitry layer and smaller and smaller feature sizes. As the feature sizes have shrunk, patterns have become smaller, and device performance parameters tighter and more robust. As a result, various issues which heretofore could be tolerated, can no longer be tolerated or have become more of an issue due to the smaller feature size.

In the production of advanced integrated circuits, to minimize problems associated with the higher density and to optimize performance, both high k and low k insulators, and assorted barrier layer materials have been employed.

Cobalt (Co) is utilized for semiconductor devices, liquid crystal displays, MEMS (Micro Electro Mechanical Systems), printed wiring boards and the like, and as ground layers and cap layers for precious metal, aluminum (Al) and copper (Cu) wiring. In semiconductor devices, it may be used as a metal contact, an interconnect, a trench fill, or a cap layer. In the construction of devices for these applications, Co frequently needs to be etched. In the various types of uses and device environments of Co, other layers are in contact with or otherwise exposed at the same time as the Co is etched. Highly selective etching of the Co in the presence of these other materials (e.g. metal conductors, dielectric, and hard marks) is mandatory for device yield and long life.

SUMMARY OF THE DISCLOSURE

The present disclosure is based on the unexpected discovery that certain etching compositions can selectively etch Co without substantially forming cobalt oxide by-products (e.g., a passive CoOx hydroxide layer (e.g., on a Co or CoOx layer) or an excessive amount of CoOx) in the semiconductor device, thereby enabling an efficient Co etch with improved uniformity and low to no residual CoOx hydroxide (CoOx-OH).

In one aspect, the disclosure features an etching composition that includes 1) a compound of formula (I): $R_1$—O—N—$R_2R_3$, in which each of $R_1$, $R_2$, and $R_3$, independently, is H or $C_1$-$C_6$ alkyl; 2) at least one unsaturated $C_3$-$C_{12}$ carboxylic acid; 3) at least one leveling agent; and 4) water.

In another aspect, the disclosure features a method that includes contacting a semiconductor substrate containing a Co feature with an etching composition described herein to remove at least a portion of the Co feature.

In still another aspect, the disclosure features an article formed by the method described above, in which the article is a semiconductor device (e.g., an integrated circuit).

DETAILED DESCRIPTION OF THE DISCLOSURE

As defined herein, unless otherwise noted, all percentages expressed should be understood to be percentages by weight to the total weight of the composition. Unless otherwise noted, ambient temperature is defined to be between about 16 and about 27 degrees Celsius (° C.).

As defined herein, a "water-soluble" substance (e.g., a water-soluble alcohol, ketone, ester, ether, and the like) refers to a substance having a solubility of at least 0.5% by weight (e.g., at least 1% by weight or at least 5% by weight) in water at 25° C.

Tautomerization is herein defined as the formal migration of a hydrogen atom or proton accompanied by a switch of a single and an adjacent double bond. The mention, description, or claim of triazole compounds also includes the tautomers of the triazole compounds due to the low activation energy for tautomerization in the triazole ring system.

In general, the disclosure features an etching composition (e.g., an etching composition for selectively removing or etching Co) that includes (e.g., comprises, consists essentially of, or consists of) 1) a compound of formula (I): $R_1$—O—N—$R_2R_3$, in which each of $R_1$, $R_2$, and $R_3$, independently, is H or $C_1$-$C_6$ alkyl; 2) at least one unsaturated $C_3$-$C_{12}$ carboxylic acid; 3) at least one leveling agent; and 4) water.

The etching composition of this disclosure can include at least one (e.g., two, three, or four) compound of formula (I): $R_1$—O—N—$R_2R_3$, in which each of $R_1$, $R_2$, and $R_3$, independently, is H or $C_1$-$C_6$ alkyl (e.g., methyl, ethyl, propyl, isopropyl, n-butyl, or t-butyl). Examples of suitable compounds of formula (I) include hydroxylamine, N-tert-butylhydroxylamine, and N,O-dimethylhydroxylamine.

In some embodiments, the at least one compound of formula (I) can be from at least about 0.01% by weight (e.g., at least about 0.05% by weight, at least about 0.1% by weight, at least about 0.2% by weight, at least about 0.3% by weight, at least about 0.4% by weight, at least about 0.5% by weight, at least about 0.6% by weight, at least about 0.7% by weight, at least about 0.8% by weight, at least about 0.9% by weight, or at least about 1% by weight) to at most about 10% by weight (e.g., at most about 8 wt %, at most about 6 wt %, at most about 5 wt %, at most about 4 wt %, at most about 2 wt %, at most about 1 wt %, or at most about 0.8 wt %) of the total weight of the etching composition. Without wishing to be bound by theory, it is believed that the compounds of formula (I) can form intermediates with Co during the etching process to facilitate and enhance the removal of Co on a semiconductor substrate.

In general, the etching composition of this disclosure can include at least one (e.g., two, three, or four) unsaturated $C_3$-$C_{12}$ carboxylic acid. In some embodiments, the unsaturated $C_3$-$C_{12}$ carboxylic acid can include one or more (e.g., two or three) carbon-carbon double or triple bonds and/or one or more (e.g., two or three) carboxylic acid groups. In some embodiments, the unsaturated carboxylic acid can be non-aromatic and/or non-cyclic (e.g., without a ring structure). In some embodiments, the unsaturated carboxylic acid can include one or more heteroatoms (e.g., N, O, or S) in addition to the oxygen atoms in the carboxylic groups. In some embodiment, the unsaturated carboxylic acid can be an acid of formula (II): R—(COOH)n (II), in which n is 1, 2, or 3 and R is $C_2$-$C_{11}$ alkenyl or $C_2$-$C_{11}$ alkynyl, where the alkenyl or alkynyl is optionally substituted with $C_1$-$C_4$ alkyl, aryl (e.g., phenyl), or heteroaryl (e.g., furyl). For example, the unsaturated carboxylic acid can include acrylic acid, crotonic acid, 2-pentenoic acid, trans-2-hexenoic acid, fumaric acid, 10-undecenoic acid, 2-methyl-2-pentenoic acid, 2-pentenoic acid, 2-methyl-4-pentenoic acid, 2-octenoic acid, and 3-(2-furyl)acrylic acid.

In some embodiments, the at least one unsaturated $C_3$-$C_{12}$ carboxylic acid can be from at least about 0.01% by weight (e.g., at least about 0.02% by weight, at least about 0.05% by weight, at least about 0.1% by weight, at least about 0.2% by weight, or at least about 0.5% by weight) to at most about 3% by weight (e.g., at most about 2.5 wt %, at most about 2 wt %, at most about 1.5 wt %, at most about 1 wt %, at most about 0.8 wt %, or at most about 0.5 wt %) of total weight of the etching composition. Without wishing to be bound by theory, it is believed that the unsaturated carboxylic acid can minimize or prevent formation of a secondary passive CoOx hydroxide layer on a CoOx layer or formation of an excessive amount of CoOx in a semiconductor substrate.

In some embodiments, the etching composition of this disclosure can include at least one leveling agent. As used herein, the term "leveling agent" refers to an organic compound that is capable of providing a substantially planar metal layer. In some embodiments, the at least one leveling agent can include a polymer, such as a sulfur-containing polymer or an nitrogen-containing polymer. Examples of leveling agents include poly(4-styrene sulfonic acid), polyethylene imine, polyglycine, poly(allylamine), polyaniline, sulfonated polyaniline, polyurea, polyacrylamide, poly (melamine-co-formaldehyde), polyaminoamide, or polyalkanolamine.

In some embodiments, the at least one leveling agent can be from at least about 0.01% by weight (e.g., at least about 0.02% by weight, at least about 0.05% by weight, at least about 0.1% by weight, at least about 0.2% by weight, or at least about 0.5% by weight) to at most about 3% by weight (e.g., at most about 2.5 wt %, at most about 2 wt %, at most about 1.5 wt %, at most about 1 wt %, at most about 0.8 wt %, or at most about 0.5 wt %) of total weight of the etching composition. Without wishing to be bound by theory, it is believed that the leveling agent can form a substantially planar metal layer on a semiconductor substrate.

In general, the etching composition of this disclosure can include water as a solvent. In some embodiments, the water can be de-ionized and ultra-pure, contain no organic contaminants and have a minimum resistivity of about 4 to about 17 mega Ohms, or at least about 17 mega Ohms. In some embodiments, the water is in an amount of from at least about 50 wt % (e.g., at least about 50% by weight, at least about 55% by weight, at least about 65% by weight, at least about 70% by weight, at least about 75% by weight, at least about 80% by weight, at least about 85% by weight, at least about 90% by weight, or at least about 95% by weight) to at most about 99 wt % (e.g., at most about 98 wt %, at most about 97 wt %, at most about 95 wt %, at most about 90 wt %, at most about 85 wt %, at most about 80 wt %, at most about 75 wt %, or at most about 70 wt %) of the etching composition. Without wishing to be bound by theory, it is believed that, if the amount of water is greater than 99 wt % of the composition, it would adversely impact the Co etch rate, and reduce its removal during the etching process. On the other hand, without wishing to be bound by theory, it is believed that the etching composition of this disclosure should include a certain level of water (e.g., at least about 50 wt %) to keep all other components solubilized and to avoid reduction in the etching performance.

In some embodiments, the etching composition of this disclosure can optionally further include at least one (e.g., two, three, or four) Co etch accelerating agent. The Co etch accelerating agent can be selected from the group consisting of carboxylic acids or amino acids (e.g., those including mono-, bi-, tri-, and polycarboxylic acid groups). In some embodiments, the Co etch accelerating agent can include water soluble carboxylic acids or amino acids. Examples of suitable Co etch accelerating agent can include citric acid, formic acid, acetic acid, oxalic acid, glycine, glycolic acid, malonic acid, lactic acid, and diethylenetriaminepentaacetic acid.

In some embodiments, the Co etch accelerating agent is in an amount of from at least about 0.01% by weight (e.g., at least about 0.02% by weight, at least about 0.05% by weight, at least about 0.1% by weight, at least about 0.2% by weight, or at least about 0.5% by weight) to at most about 3% by weight (e.g., at most about 2.5 wt %, at most about 2 wt %, at most about 1.5 wt %, at most about 1 wt %, at most about 0.8 wt %, or at most about 0.5 wt %) of the etching composition. Without wishing to be bound by theory, it is believed that the Co etch accelerating agent can form enhance the etching or removal of Co from the semiconductor substrate.

In some embodiments, the etching composition of this disclosure can optionally further include at least one (e.g., two, three, or four) organic solvent. The organic solvent can be selected from the group consisting of water soluble alcohols, water soluble ketones, water soluble esters, and water soluble ethers.

Classes of water soluble alcohols include, but are not limited to, alkane diols (including, but not limited to, alkylene glycols), glycols, alkoxyalcohols (including, but not limited to, glycol monoethers), saturated aliphatic monohydric alcohols, unsaturated non-aromatic monohydric alcohols, and low molecular weight alcohols containing a ring structure.

Examples of water soluble alkane diols includes, but are not limited to, 2-methyl-1,3-propanediol, 1,3-propanediol, 2,2-dimethyl-1,3-propanediol, 1,4-butanediol, 1,3-butanediol, 1,2-butanediol, 2,3-butanediol, pinacol, and alkylene glycols.

Examples of water soluble alkylene glycols include, but are not limited to, ethylene glycol, propylene glycol, diethylene glycol, dipropylene glycol, triethylene glycol and tetraethylene glycol.

Examples of water soluble alkoxyalcohols include, but are not limited to, 3-methoxy-3-methyl-1-butanol, 3-methoxy-1-butanol, 1-methoxy-2-butanol, and water soluble glycol monoethers.

Examples of water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol monobutyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of water soluble saturated aliphatic monohydric alcohols include, but are not limited to methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of water soluble unsaturated non-aromatic monohydric alcohols include, but are not limited to allyl alcohol, propargyl alcohol, 2-butenyl alcohol, 3-butenyl alcohol, and 4-penten-2-ol.

Examples of water soluble, low molecular weight alcohols containing a ring structure include, but are not limited, to tetrahydrofurfuryl alcohol, furfuryl alcohol, and 1,3-cyclopentanediol.

Examples of water soluble ketones include, but are not limited to, acetone, propanone, cyclobutanone, cyclopentanone, cyclohexanone, diacetone alcohol, 2-butanone, 5-hexanedione, 1,4-cyclohexanedione, 3-hydroxyacetophenone, 1,3-cyclohexanedione, and cyclohexanone.

Examples of water soluble esters include, but are not limited to, ethyl acetate, glycol monoesters (such as ethylene glycol monoacetate and diethyleneglycol monoacetate), and glycol monoether monoesters (such as propylene glycol monomethyl ether acetate, ethylene glycol monomethyl ether acetate, propylene glycol monoethyl ether acetate, and ethylene glycol monoethyl ether acetate).

In some embodiments, the at least one organic solvent can be from at least about 0.5 wt % (e.g., at least about 1% by weight, at least about 2% by weight, at least about 4% by weight, at least about 5% by weight, at least about 6% by weight, at least about 8% by weight, or at least about 10% by weight) to at most about 30 wt % (e.g., at most about 25 wt %, at most about 20 wt %, at most about 18 wt %, at most about 16 wt %, at most about 15 wt %, at most about 14 wt %, at most about 12 wt %, or at most about 10 wt %) of the total weight of the etching composition.

In some embodiments, the etching composition of this disclosure can optionally further include at least one (e.g., two, three, or four) pH adjust agent, such as an acid or a base. In some embodiments, the pH adjusting agent can be a base free of a metal ion. Suitable metal ion free bases include quaternary ammonium hydroxides (e.g., a tetraalkylammonium hydroxide such as TMAH), ammonium hydroxides, amines (including alkanolamines), amidines (such as 1,8-diazabicyclo[5.4.0]-7-undecene (DBU) and 1,5-diazabicyclo[4.3.0]-5-nonene (DBN)), and guanidine salts (such as guanidine carbonate). In some embodiments, the base is not a quaternary ammonium hydroxide (e.g., a tetraalkylammonium hydroxide such as TMAH).

In some embodiments, the pH adjusting agent can be an organic acid, such as a sulfonic acid (e.g., methanesulfonic acid, trifluoromethanesulfonic acid, and p-toluenesulfonic acid).

In some embodiments, when the pH adjusting agent is an organic acid, the organic acid is not an unsaturated carboxylic acid described above or a saturated carboxylic acid containing one or more (e.g., two, three, or four) carboxyl groups (e.g., citric acid, oxalic acid, or acetic acid). In some embodiments, the pH adjusting agent is not a hydrogen halide.

In general, the pH adjusting agent in the etching composition of this disclosure can be in an amount sufficient to adjust the pH of the etching composition to a desired value.

In some embodiments, the pH adjusting agent can be from at least about 0.01 wt % (e.g., at least about 0.05 wt %, at least about 0.1 wt %, at least about 0.5 wt %, at least about 1 wt %, or at least about 2 wt %) to at most about 6 wt % (e.g., at most about 5.5 wt %, at most about 5 wt %, at most about 4 wt %, at most about 3 wt %, at most about 2 wt %, or at most about 1 wt %) of the total weight of the etching composition.

In some embodiments, the etching composition of this disclosure can have a pH of at least about 0 (e.g., at least about 0.2, at least about 0.4, at least about 0.5, at least about 0.6, at least about 0.8, at least about 1, at least about 1.5, at least about 2, at least about 2.5, or at least about 3) and/or at most about 7 (e.g., at most about 6.5, at most about 6, at most about 5.5, at most about 5, at most about 4.5, at most about 4, at most about 3.5, or at most about 3). Without wishing to be bound by theory, it is believed that an etching composition having a pH higher than 7 would not have sufficient Co etch rate. Further, it is believed that an etching composition having a pH lower than 0 could produce an excessive Co etch, prevent certain components (e.g., a metal corrosion inhibitor) in the composition from functioning, or decompose certain components in the composition due to strong acidity.

In addition, in some embodiments, the etching composition of the present disclosure may contain additives such as, additional corrosion inhibitors, surfactants, additional organic solvents, biocides, and defoaming agents as optional components. Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference). Examples of suitable surfactants may be cationic, anionic, nonionic or amphoteric.

For example, the etching composition of this disclosure can include at least one (e.g., two, three, or four) metal corrosion inhibitor. Examples of corrosion inhibitors include substituted or unsubstituted azole compounds, such as triazole compounds, imidazole compounds and tetrazole compounds. Triazole compounds can include triazole, benzotriazole, substituted triazole, and substituted benzotriazole. Examples of triazole compounds include, but are not limited to, 1,2,4-triazole, 1,2,3-triazole, or triazoles substituted with substituents such as $C_1$-$C_8$ alkyl (e.g., 5-methyltriazole), amino, thiol, mercapto, imino, carboxy and nitro groups. Specific examples include tolyltriazole, 5-methyl-1,2,4-triazole, 3-amino-5-mercapto-1,2,4-triazole, 1-amino-1,2,4-triazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, and the like.

In some embodiments, the at least one metal corrosion inhibitor can include a benzotriazole optionally substituted by at least one substituent selected from the group consisting of alkyl groups, aryl groups, halogen groups, amino groups, nitro groups, alkoxy groups, and hydroxyl groups. Examples include benzotriazole, 5-aminobenzotriazole, hydroxybenzotriazoles (e.g., 1-hydroxybenzotriazole), 5-phenylthiolbenzotriazole, halo-benzotriazoles (halo=F, Cl, Br or I) (such as 5-chlorobenzotriazole, 4-chlorobenzotriazole, 5-bromobenzotriazole, 4-bromobenzotriazole, 5-fluorobenzotriazole, and 4-fluorobenzotriazole), naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-dimethylpropyl)-benzotriazole, 5-(1',1',3'-trimethylbutyl)benzotriazole, 5-n-octylbenzotriazole, and 5-(1',1',3',3'-tetramethylbutyl)benzotriazole.

Examples of imidazole compounds include, but are not limited to, 2-alkyl-4-methyl imidazole, 2-phenyl-4-alkyl imidazole, 2-methyl-4(5)-nitroimidazole, 5-methyl-4-nitroimidazole, 4-Imidazolemethanol hydrochloride, and 2-mercapto-1-methylimidazole.

Examples of tetrazole compounds include 1-H-tetrazole, 5-methyl-1H-tetrazole, 5-phenyl-1H-tetrazole, 5-amino-1H-tetrazole, 1-phenyl-5-mercapto-1H-tetrazole, 5,5'-bis-1H-tetrazole, 1-methyl-5-ethyltetrazole, 1-methyl-5-mercaptotetrazole, 1-carboxymethyl-5-mercaptotetrazole, and the like.

In some embodiments, the at least one metal corrosion inhibitor can be from at least about 50 ppm or about 0.005% by weight (e.g., at least about 0.01% by weight, at least about 0.02% by weight, at least about 0.05% by weight, at least about 0.1% by weight, at least about 0.2% by weight, or at least about 0.5% by weight) to at most about 3% by weight (e.g., at most about 2.5 wt %, at most about 2 wt %, at most about 1.5 wt %, at most about 1 wt %, at most about 0.8 wt %, or at most about 0.5 wt %) of total weight of the etching composition.

In general, the etching composition of the present disclosure can have a relatively high Co/dielectric material (e.g., SiN, polysilicon, high k dielectrics, AlOx, SiOx, or SiCO) etch selectivity (i.e., a high ratio of Co etch rate over dielectric material etch rate). In some embodiments, the etching composition can have a Co/dielectric material etch selectivity of at least about 2 (e.g., at least about 3, at least about 4, at least about 5, at least about 6, at least about 7, at least about 8, at least about 9, at least about 10, at least about 15, at least about 20, at least about 30, at least about 40, or at least about 50) and/or at most about 500 (e.g., at most about 100).

In some embodiments, the etching composition of the present disclosure may specifically exclude one or more of the additive components, in any combination if more than one. Such components are selected from the group consisting of organic solvents, pH adjusting agents, polymers (e.g., cationic or anionic polymers), oxygen scavengers, quaternary ammonium salts (including quaternary ammonium hydroxides), amines, alkaline bases (such as NaOH, KOH, and LiOH), surfactants other than a defoamer, a defoamer, fluoride containing compounds, oxidizing agents (e.g., peroxides, hydrogen peroxide, inorganic oxidizing agents (e.g., ferric nitrate, potassium iodate, potassium permanganate, and nitric acid), ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, and peracids (e.g., peracetic acid)), abrasives (e.g., cationic or anionic abrasives), silicates, hydroxycarboxylic acids (e.g., those containing more than two hydroxyl groups), carboxylic and polycarboxylic acids (e.g., those containing or lacking amino groups), silanes (e.g., alkoxysilanes), cyclic compounds (e.g., azoles (such as diazoles, triazoles, or tetrazoles), triazines, and cyclic compounds containing at least two rings, such as substituted or unsubstituted naphthalenes, or substituted or unsubstituted biphenylethers), buffering agents, non-azole corrosion inhibitors, azoles (e.g., diazoles, triazoles, or tetrazoles), and salts (e.g., sulfate salts, sulfonate salts, halide salts (e.g., chloride salts), nitrate salts, acetate salts, phosphate salts, and metal salts such as metal halides, potassium salts (e.g., potassium nitrate), sodium salts, and silver salts).

The etching composition of this disclosure can be prepared by simply mixing the components together, or can be prepared by blending two compositions in a kit. The first composition in the kit can be an aqueous solution containing one or more components described above. The second composition in the kit can contain the remaining components of the etching composition of this disclosure at predetermined ratios in a concentrated form such that the blending of the two compositions will yield a desired etching composition of the disclosure.

In some embodiments, the present disclosure features a method of etching a semiconductor substrate containing at least one Co feature (e.g., a Co film or layer) to remove at least a portion of the Co feature. In some embodiments, the Co feature can be a Co filled via or trench. In some embodiments, the method can remove from at least about 10% (e.g., at least about 20%, at least about 30%, at least about 40%, at least about 50%, at least about 60%, at least about 70%, at least about 80%, at least about 90%, or 100%) of the Co feature (e.g., the Co filled in a via or trench).

In some embodiments, the method can include contacting a semiconductor substrate containing the at least one Co feature with an etching composition of this disclosure to remove at least a portion of the Co feature. The method can further include rinsing the semiconductor substrate with a rinse solvent after the contacting step and/or drying the semiconductor substrate after the rinsing step.

In some embodiments, an advantage of the method described herein is that it does not substantially form a cobalt oxide hydroxide (CoOx hydroxide or CoOx-OH) layer on a CoOx layer in the semiconductor substrate that is exposed to the etching composition. For example, the method does not form more than about 5 Å (e.g., more than about 3 Å or more than about 1 Å) of a CoOx hydroxide layer on the semiconductor substrate. Without wishing to be bound by theory, it is believed that the CoOx-OH layer can be dark in color and can be a non-uniform, porous oxide of varying thickness that may cause uneven etching. Thus, such a secondary oxide layer is generally undesired over a normal Co/CoO metal surface.

In some embodiments, other advantages of the method described herein include that the method can allow Co to be selectively removed uniformly and/or to be etched to reach a targeted depth or thickness. In some embodiments, the method can provide a non-rough Co surface post etch.

In some embodiments, the etching method includes the steps of:

(A) providing a semiconductor substrate containing a Co feature;

(B) contacting the semiconductor substrate with an etching composition described herein;

(C) rinsing the semiconductor substrate with one or more suitable rinse solvents; and (D) optionally, drying the semiconductor substrate (e.g., by any suitable means that removes the rinse solvent and does not compromise the integrity of the semiconductor substrate).

Semiconductor substrates described herein (e.g., wafers) typically are constructed of silicon, silicon germanium, Group III-V compounds such as GaAs, or any combination thereof. The semiconductor substrates can additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, silicon, titanium nitride, tantalum nitride, and tungsten. The semiconductor substrates may also contain layers of interlayer dielectrics, polysilicon, silicon oxide, silicon nitride, silicon carbide, titanium oxide, and carbon doped silicon oxides.

A semiconductor substrate can be contacted with the etching composition by any suitable method, such as placing the etching composition into a tank and immersing and/or submerging the semiconductor substrate into the etching composition, spraying the etching composition onto the semiconductor substrate, streaming the etching composition onto the semiconductor substrate, or any combinations thereof.

The etching composition of the present disclosure can be effectively used up to a temperature of about 85° C. (e.g., from about 20° C. to about 80° C., from about 55° C. to about 65° C., or from about 60° C. to about 65° C.). The etch rates of Co increase with temperature in this range, thus the processes at a higher temperature can be run for shorter times. Conversely, lower etching temperatures typically require longer etching times.

Etching times can vary over a wide range depending on the particular etching method, thickness, and temperature employed. When etching in an immersion batch type process, a suitable time range is, for example, up to about 10 minutes (e.g., from about 1 minute to about 7 minutes, from about 1 minute to about 5 minutes, or from about 2 minutes to about 4 minutes). Etching times for a single wafer process can range from about 30 seconds to about 5 minutes (e.g., from about 30 seconds to about 4 minutes, from about 1 minute to about 3 minutes, or from about 1 minute to about 2 minutes). Etching times in a cycle process (e.g., in which a wafer is etched, rinsed, and dried in up to 16 cycles) can range from about 10 seconds to about 2 minutes per cycle.

To further promote the etching ability of the etching composition of the present disclosure, mechanical agitation means can be employed. Examples of suitable agitation means include circulation of the etching composition over the substrate, streaming or spraying the etching composition over the substrate, and ultrasonic or megasonic agitation during the etching process. The orientation of the semiconductor substrate relative to the ground can be at any angle. Horizontal or vertical orientations are preferred.

Subsequent to the etching, the semiconductor substrate can be rinsed with a suitable rinse solvent for about 5 seconds up to about 5 minutes with or without agitation means. Multiple rinse steps employing different rinse solvents can be employed. Examples of suitable rinse solvents include, but are not limited to, deionized (DI) water, methanol, ethanol, isopropyl alcohol, N-methylpyrrolidone, gamma-butyrolactone, dimethyl sulfoxide, ethyl lactate and propylene glycol monomethyl ether acetate. Alternatively, or in addition, aqueous rinses with pH>8 (such as dilute aqueous ammonium hydroxide) can be employed. Examples of rinse solvents include, but are not limited to, dilute aqueous ammonium hydroxide, DI water, methanol, ethanol, and isopropyl alcohol. The rinse solvent can be applied using means similar to that used in applying an etching composition described herein. The etching composition may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art can be employed. Examples of suitable drying means include spin drying, flowing a dry gas across the semiconductor substrate, heating the semiconductor substrate with a heating means such as a hotplate or infrared lamp, Marangoni drying, rotagoni drying, isopropyl alcohol (IPA) drying or any combinations thereof. Drying times will be dependent on the specific method employed but are typically on the order of 30 seconds up to several minutes.

In some embodiments, the etching method described herein further includes forming a semiconductor device (e.g., an integrated circuit device such as a semiconductor chip) from the semiconductor substrate obtained by the method described above.

The present disclosure is illustrated in more detail with reference to the following examples, which are for illustrative purposes and should not be construed as limiting the scope of the present disclosure.

EXAMPLES

Any percentages listed are by weight (wt %) unless otherwise specified. Controlled stirring during testing was done with a ½ inch stirring bar at 325 rpm unless otherwise noted.

General Procedure 1

Formulation Blending

Samples of etching compositions were prepared by adding, while stirring, to the calculated amount of the solvent the remaining components of the formulation. After a uniform solution was achieved, optional additives, if used, were added.

General Procedure 2

Materials and Methods

Blanket test coupons were evaluated for etching and materials compatibility in the test solutions prepared by General Procedure 1 according to the procedures described in General Procedure 3.

Blanket film etch rate measurements on films were carried out using commercially available unpatterned 200 mm diameter wafers that were diced into 1.0"×1.0" test coupons for evaluation. The blanket film material used for testing was a Co film of about 2000 Å thickness deposited on a silicon substrate.

The blanket film test coupons were measured for pre-treatment and post-treatment thickness to determine blanket film etch rates. The thickness of the Co film was measured pre-treatment and post-treatment by using a CDE RESMAP 4 point probe.

The CoOx-OH layer was measured using a Woolam Ellipsometer as follows. First, Co films with a native CoOx layer were measured based on an ellipsometry model with several different pre-cleaned Co films to confirm that a CoOx layer having a thickness of about 10 Å was detected only over the opaque Co metal layer. Subsequently, the CoOx layer was used as a first layer to establish an ellipsometry model for measuring the CoOx-OH layer thickness over the 10 Å CoOx layer. The presence of the CoOx layer and the CoOx-OH layer was confirmed by XPS.

General Procedure 3

Etching Evaluation with Beaker Test

All blanket film etch testing was carried out at 50° C. in a 125 ml PTFE bottle containing 100 g of a sample solution with continuous stirring at 325 rpm contained in a 600 ml glass beaker water bath, with the PTFE bottle cap seal used during heating to minimize evaporative losses. All blanket test coupons having a blanket dielectric film exposed on one side to the sample solution were diced by diamond scribe into 0.5"×0.5" square test coupon size for beaker scale testing. Each individual test coupon was held into position using a single 4" long, locking plastic tweezers clip. The test coupon, held on one edge by the locking tweezers clip, was suspended into the 125 mL PTFE bottle and immersed into the 100 g sample solution while the solution was stirred continuously at 325 rpm at 50° C. The PTFE bottle was open to atmosphere only during the short coupon process time and was recovered with the bottle cap during any heating or delays in process time.

The test coupons were suspended by the clip held static in the stirred solution at the exact same position for each test until the treatment time (e.g., 2 to 10 minutes) had elapsed. After the treatment time in the test solution had elapsed, the test coupons were immediately removed from the 125 mL PTFE bottle and rinsed with DI water for 10 seconds twice. After the final DI rinse step, all test coupons were subject to a filtered nitrogen gas blow off step using a hand held nitrogen gas blower which forcefully removed all traces of DI water to produce a final dry sample for test measurements.

Example 1

Formulation Examples 1-9 (FE-1 to FE-9) and Comparative Formulation Example 1 (CFE-1) were prepared according to General Procedure 1, and evaluated according to General Procedures 2 and 3. The formulations and the test results are summarized in Table 1.

TABLE 1

| Composition [wt %] | FE-1 | FE-2 | FE-3 | FE-4 | FE-5 | FE-6 | FE-7 | FE-8 | FE-9 | CFE-1 |
|---|---|---|---|---|---|---|---|---|---|---|
| Hydroxylamine | 0.5% | 0.5% | 0.5% | 0.5% | 0.5% | 0.5% | 0.5% | 0.5% | 0.5% | 0.5% |
| Unsaturated carboxylic acid | CA 0.2% | AA 0.2% | FA 0.2% | UDA 0.2% | PA 0.2% | MPA 0.2% | OA 0.2% | THA 0.2% | FAA 0.2% | None |
| Citric acid | 0.05% | 0.05% | 0.05% | 0.05% | 0.05% | 0.05% | 0.05% | 0.05% | 0.05% | 0.05% |
| PSSA | 0.2% | 0.2% | 0.2% | 0.2% | 0.2% | 0.2% | 0.2% | 0.2% | 0.2% | 0.2% |
| MSA | 1.38% | 1.2% | 1.16% | 1.4% | 1.38% | 1.38% | 1.4% | 1.38% | 1.4% | 1.4% |
| Water | 97.7% | 97.9% | 97.9% | 97.7% | 97.7% | 97.7% | 97.7% | 97.7% | 97.7% | 97.9% |
| Total | 100% | 100% | 100% | 100% | 100% | 100% | 100% | 100% | 100% | 100% |
| pH at 25° C. | 3.6 | 3.6 | 3.6 | 3.6 | 3.6 | 3.6 | 3.6 | 3.6 | 3.6 | 3.6 |
| Test results | | | | | | | | | | |
| Co ER (Å/min) | 745 | 135.5 | >1100 | 480.5 | 379 | 821.5 | 1 | 237.5 | 68.5 | >1100 |
| CoOx—OH layer thickness (Å) | 0 | 0 | N/A | 30-100[1] | 0.14 | N/A | 0 | 0 | 0 | N/A |
| Co surface finish | Mirror | Mirror | N/A | N/A | Mirror | N/A | Mirror | Mirror | Mirror | N/A |

CA = Crotonic acid
AA = Acrylic acid
FA = Fumaric acid
UDA = 10-undecenoic acid
PA = 2-Pentenoic acid
MPA = 2-Methyl-4-pentenoic acid
OA = 2-Octenoic acid
THA = Trans-2-Hexenoic acid
FAA = 3-(2-Furyl)acrylic acid
PSSA = Poly (4-styrene sulfonic acid)
MSA = Methanesulfonic acid
[1] = estimated value
N/A = Not measureable or not applicable As shown in Table 1, formulations FE-1, FE-2, FE-5, FE-8 and FE-9 exhibited relatively high Co etch rates, produced a mirror surface on the Co metal film, and did not result in a passive CoOx-OH layer. By contrast, although formulation CF-1 exhibited a high Co etch rate, the Co metal film was damaged or destroyed to a point where it cannot be read by the ellipsometry.

While the invention has been described in detail with reference to certain embodiments thereof, it will be understood that modifications and variations are within the spirit and scope of that which is described and claimed.

What is claimed is:
1. An etching composition, comprising:
1) a compound of formula (I): $R_1$—O—N—$R_2R_3$, in which each of $R_1$, $R_2$, and $R_3$, independently, is H or $C_1$-$C_6$ alkyl;
2) at least one unsaturated $C_3$-$C_{12}$ carboxylic acid;
3) at least one leveling agent comprising a sulfur-containing polymer or a nitrogen-containing polymer, wherein the nitrogen-containing polymer is selected from the group consisting of poly(allylamine), polyaniline, sulfonated polyaniline, polyurea, poly(melamine-co-formaldehyde), polyaminoamide, and polyalkanolamine; and 4) water;

wherein the composition is free of a tetrazole.

2. The composition of claim 1, wherein the composition has a pH from about 0 to about 7.

3. The composition of claim 1, wherein the compound of formula (I) is hydroxylamine.

4. The composition of claim 1, wherein the compound of formula (I) is in the amount of from about 0.01% to about 10% by weight of the composition.

5. The composition of claim 1, wherein the at least one unsaturated $C_3$-$C_{12}$ carboxylic acid comprises acrylic acid, crotonic acid, 2-pentenoic acid, trans-2-hexenoic acid, fumaric acid, 10-undecenoic acid, 2-methyl-2-pentenoic acid, 2-pentenoic acid, 2-methyl-4-pentenoic acid, 2-octenoic acid, or 3-(2-furyl)acrylic acid.

6. The composition of claim 1, wherein the at least one unsaturated carboxylic $C_3$-$C_{12}$ acid is in the amount of from about 0.01% to about 3% by weight of the composition.

7. The composition of claim 1, wherein the at least one leveling agent comprises poly(4-styrene sulfonic acid).

8. The composition of claim 1, wherein the at least one leveling agent is in the amount of from about 0.01% to about 3% by weight of the composition.

9. The composition of claim 1, wherein the water is in the amount of from about 50% to about 99% by weight of the composition.

10. The composition of claim 1, further comprising at least one Co etch accelerating agent, wherein the at least one Co etch accelerating agent comprises an acid.

11. The composition of claim 10, wherein the at least one Co etch accelerating agent comprises an acid selected from the group consisting of carboxylic acids or amino acids.

12. The composition of claim 10, wherein the at least one Co etch accelerating agent comprises citric acid, formic acid, acetic acid, oxalic acid, glycine, glycolic acid, malonic acid, lactic acid, or diethylenetriaminepentaacetic acid.

13. The composition of claim 10, wherein the least one Co etch accelerating agent is in the amount of from about 0.01% to about 3% by weight of the composition.

14. The composition of claim 1, further comprising at least one pH adjusting agent.

15. The composition of claim 14, wherein the at least one pH adjusting agent comprises a base or an acid.

16. The composition of claim 15, wherein the base is free of a metal ion and is not a quaternary ammonium hydroxide or an alkyl hydroxide, and the acid is not a saturated carboxylic acid or a hydrogen halide.

17. The composition of claim 14, wherein the least one pH adjusting agent is in the amount of from about 0.01% to about 6% by weight of the composition.

18. The composition of claim 1, further comprising an organic solvent selected from the group consisting of water soluble alcohols, water soluble ketones, water soluble esters, and water soluble ethers.

19. The composition of claim 18, wherein the organic solvent is in the amount of from about 0.5% to about 30% by weight of the composition.

20. A method, comprising:
   contacting a semiconductor substrate containing a Co feature with a composition of claim 1 to remove at least a portion of the Co feature.

21. The method of claim 20, further comprising rinsing the semiconductor substrate with a rinse solvent after the contacting step.

22. The method of claim 21, further comprising drying the semiconductor substrate after the rinsing step.

23. The method of claim 20, wherein the method does not substantially form a cobalt oxide hydroxide layer in the semiconductor substrate.

24. An etching composition, comprising:
   1) a compound of formula (I): $R_1$—O—N—$R_2R_3$, in which each of $R_1$, $R_2$, and $R_3$, independently, is H or $C_1$-$C_6$ alkyl;
   2) at least one unsaturated $C_3$-$C_{12}$ carboxylic acid selected from the group consisting of acrylic acid, crotonic acid, 2-pentenoic acid, trans-2-hexenoic acid, 10-undecenoic acid, 2-methyl-2-pentenoic acid, 2-pentenoic acid, 2-methyl-4-pentenoic acid, 2-octenoic acid, and 3-(2-furyl)acrylic acid;
   3) at least one leveling agent comprising a sulfur-containing polymer or a nitrogen-containing polymer; and
   4) water;
   wherein the composition is free of a tetrazole.

* * * * *